United States Patent

Oyama

(10) Patent No.: US 9,735,689 B2
(45) Date of Patent: Aug. 15, 2017

(54) SWITCHING CONVERTER AND CONTROL CIRCUIT THEREOF, CURRENT SENSING METHOD, AC/DC CONVERTER, AND POWER ADAPTOR AND ELECTRONIC DEVICES

(71) Applicant: Rohm Co., Ltd., Kyoto (JP)

(72) Inventor: Manabu Oyama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 19 days.

(21) Appl. No.: 14/884,973

(22) Filed: Oct. 16, 2015

(65) Prior Publication Data

US 2016/0111963 A1    Apr. 21, 2016

(30) Foreign Application Priority Data

Oct. 21, 2014  (JP) ................................. 2014-214715

(51) Int. Cl.
*H02M 3/335* (2006.01)
*H02M 1/00* (2006.01)
*H03K 17/687* (2006.01)

(52) U.S. Cl.
CPC ... *H02M 3/33523* (2013.01); *H02M 3/33507* (2013.01); *H03K 17/687* (2013.01); *H02M 2001/0009* (2013.01)

(58) Field of Classification Search
CPC ......... H02M 3/33515; H02M 3/33523; H02M 3/33507
USPC .......... 363/21.12, 21.13, 21.15, 21.17, 21.18
See application file for complete search history.

(56) References Cited

U.S. PATENT DOCUMENTS

| | | | | |
|---|---|---|---|---|
| 8,098,502 B2* | 1/2012 | Mao | ........................ | H02M 1/44 363/21.03 |
| 2007/0210772 A1* | 9/2007 | Sawtell | ................. | H02M 3/156 323/282 |
| 2008/0074158 A1* | 3/2008 | Ryu | ........................ | H02M 1/36 327/143 |
| 2011/0156680 A1* | 6/2011 | Yeh | ........................ | H02M 3/156 323/282 |
| 2013/0163291 A1* | 6/2013 | Kim | ........................ | H01H 47/00 363/21.12 |

FOREIGN PATENT DOCUMENTS

JP       2003-189612       7/2003

* cited by examiner

*Primary Examiner* — Adolf Berhane
*Assistant Examiner* — Gary Nash
(74) *Attorney, Agent, or Firm* — Fish & Richardson P.C.

(57) ABSTRACT

A control circuit is used in a switching converter including at least, a switching transistor and a coil connected to the switching transistor. The control circuit includes: a current comparing circuit that asserts a peak current sensing signal when a current flowing in the coil during the ON period of the switching transistor reaches a threshold current. The current comparing circuit includes: a first comparator that compares a sensed voltage according to the current flowing in the switching transistor and the coil with a threshold voltage defining the threshold current, and generates a comparison signal; and a variable delay circuit that generates the peak current sensing signal by delaying the comparison signal, a delay amount of the variable delay circuit varying according to a period of time from a turn-on of the switching transistor to a transition of the comparison signal.

19 Claims, 14 Drawing Sheets

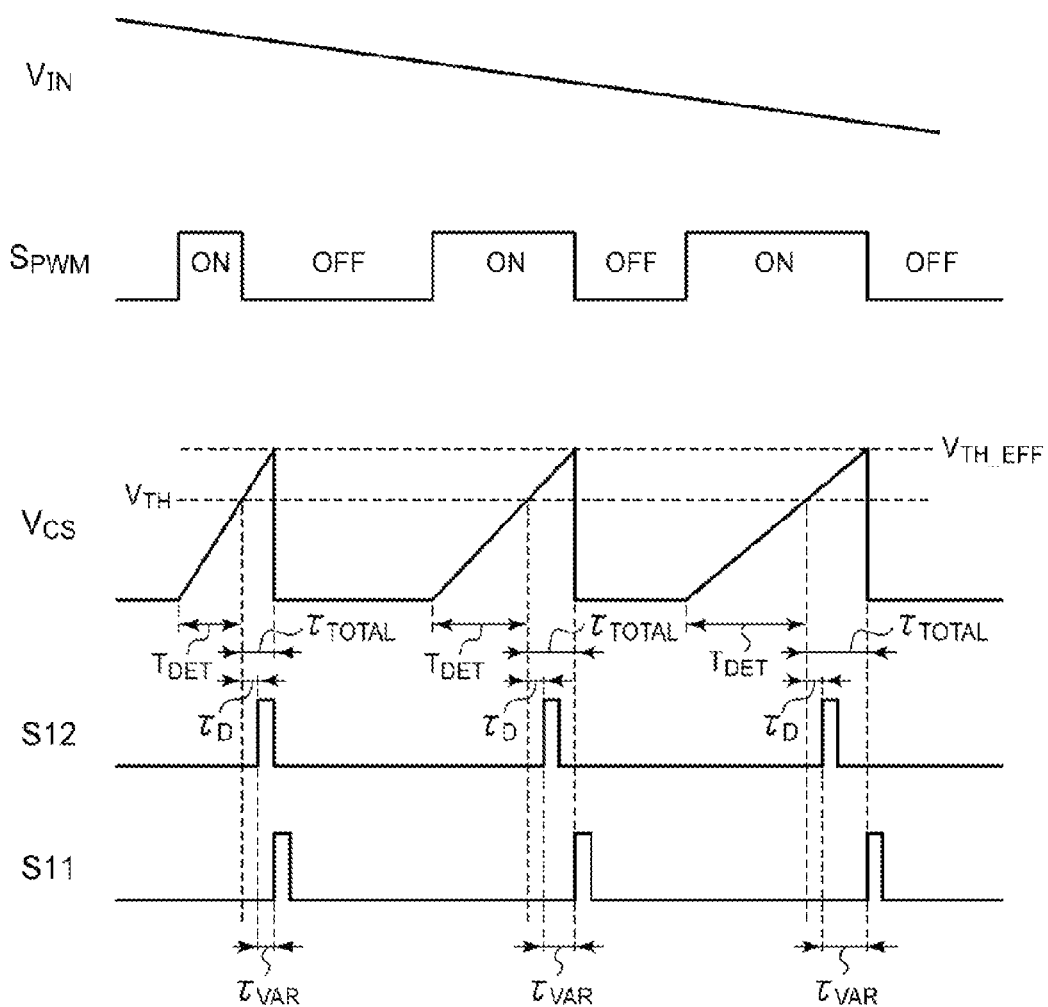

SWITCHING CONVERTER AND CONTROL CIRCUIT THEREOF, CURRENT SENSING METHOD, AC/DC CONVERTER, AND POWER ADAPTOR AND ELECTRONIC DEVICES

CROSS-REFERENCE TO RELATED APPLICATION

This application is based upon and claims the benefit of priority from Japanese Patent Application No. 2014-214715, filed on Oct. 21, 2014, the entire contents of which are incorporated herein by reference.

TECHNICAL FIELD

The present disclosure relates to a switching converter.

BACKGROUND

Various household electrical appliances including a television and a refrigerator are operated on external commercial alternating current power. Also, electronic devices including a laptop computer, a mobile phone, and a tablet PC can be operated on external commercial alternating current power or can charge batteries embedded in the electronic devices by using external commercial alternating current power. These household electrical appliances or electronic devices (hereinafter, generically referred to as "electronic devices") are embedded with power devices (inverters) for AC/DC (alternated current/direct current) converting an external commercial alternating current voltage. Alternatively, the inverters may be embedded in power adaptors (AC adaptors) outside the electronic devices.

FIG. 1 is a block diagram of an AC/DC converter 400r reviewed by the inventor of the present disclosure. Major components of the AC/DC converter 400r include a rectification circuit 402, a smoothing capacitor 404, and a DC/DC converter (switching converter) 100r.

The rectification circuit 402 is a diode bridge circuit that performs full-wave rectification of a commercial alternating current voltage $V_{AC}$. An output voltage of the rectification circuit 402 is smoothed by the smoothing capacitor 404, and is converted to a DC voltage $V_{DC}$.

The DC voltage $V_{DC}$ is supplied to an input line 104 of the insulated DC/DC converter 100r at the next stage. The DC/DC converter 100r generates an output voltage $V_{OUT}$ that is stabilized to a target level by dropping the direct current $V_{DC}$ and supplies the output voltage $V_{OUT}$ to a load (not illustrated) connected to an output line 106.

The DC/DC converter 100r includes an output circuit 102 and a control circuit 200r. The output circuit 102 includes a switching transistor M1, a current sensing resistor $R_{CS}$, a transformer T1, a rectifier diode D1, an output capacitor C1, and a feedback circuit 108. The feedback circuit 108 generates a feedback voltage $V_{FB}$ based on the output voltage $V_{OUT}$ and supplies the feedback voltage $V_{FB}$ to a feedback terminal (FB terminal) of the control circuit 200r.

The switching transistor M1 and the current sensing resistor $R_{CS}$ are connected to a primary coil $L_P$ of the transformer T1. The rectifier diode D1 and the output capacitor C1 are connected to a secondary coil Ls of the transformer T1.

An output terminal OUT of the control circuit 200r is connected to a gate of the switching transistor M1. The control circuit 200r generates a pulse signal $S_{OUT}$ having a duty ratio adjustable to make the output voltage $V_{OUT}$ approach a predetermined target level, and switches the switching transistor M1.

The control circuit 200r is configured to be capable of detecting a current flowing in the primary coil $L_P$ and the switching transistor M1 (hereinafter, referred to as a "coil current $I_P$") during the ON period of the switching transistor M1. In detail, a current sensing terminal (CS terminal) of the control circuit 200r is connected to the current sensing resistor $R_{CS}$, and a sensed voltage $V_{CS}$ in proportion to the coil current $I_P$ is input to the CS terminal. A current comparing circuit 300r compares the sensed voltage $V_{CS}$ with a predetermined threshold voltage $V_{TH}$, thereby comparing the coil current $I_P$ with a threshold current $I_{TH}$ ($=V_{TH}/R_{CS}$). Described above is the configuration of the AC/DC converter 400r.

FIG. 2 is an operation waveform diagram of the DC/DC converter 100r. When the pulse signal $S_{OUT}$ is at a high level, the switching transistor M1 is turned on. When the switching transistor M1 is turned on, the coil current $I_P$ increases as time lapses, and thus the sensed voltage $V_{CS}$ increases. When the pulse signal $S_{OUT}$ is at a low level, the switching transistor M1 is turned off. During the OFF period of the switching transistor M1, the current $I_S$ flows in the secondary coil $L_S$ and is supplied to the output capacitor C1. The output voltage $V_{OUT}$ is stabilized to a desired level by repeatedly switching the switching transistor M1.

During the ON period of the switching transistor M1, the coil current $I_P$ flows in the primary coil $L_P$ and the DC voltage $V_{DC}$ is applied to between both ends of the primary coil $L_P$. Accordingly, Equations (1) and (2) are established.

$$V_{DC}=L_P \cdot dI_P/dt \qquad (1)$$

$$V_{CS}=R_{CS} \times I_P \qquad (2)$$

Equation (3) can be obtained by modifying the above Equations (1) and (2).

$$V_{CS}=R_{CS}/L_P \times \int V_{DC} dt = (R_{CS}/L_P \times V_{DC}) \times t \qquad (3)$$

In Equation 3, ($R_{CS}/L_P \times V_{DC}$) denotes the slope [V/s] of the sensed voltage $V_{CS}$, which will be hereinafter referred to as "α". In other words, the slope α of the sensed voltage $V_{CS}$ during the ON period of the switching transistor M1 depends on the DC voltage $V_{DC}$ and the inductance of the primary coil $L_P$.

FIG. 3A is an operation waveform diagram of the current comparing circuit 300r, and FIG. 3B is a diagram illustrating an effective threshold voltage. A comparator of the current comparing circuit 300r has a response delay $\tau_D$, and an output signal $S_{CMP}$ of the comparator transits after a lapse of the response delay m from the time when it becomes $V_{CS}=V_{TH}$. The sensed voltage $V_{CS}$ when the output signal $S_{CMP}$ of the comparator is changed is referred to as an effective threshold voltage $V_{TH\_EFF}$. As illustrated in FIG. 3A, as the slope α of the sensed voltage VCS increases, the effective threshold voltage $V_{TH\_EFF}$ becomes higher than the ideal threshold voltage $V_{TH}$. The effective threshold voltage $V_{TH\_EFF}$ is given as Equation (4).

$$V_{TH\_EFF}=V_{TH}+\alpha \times \tau_D \qquad (4)$$

Therefore, in a case where the output $S_{CMP}$ of the comparator is used for overcurrent protection and the like, the slope α is changed due to fluctuation of the DC voltage $V_{DC}$ or fluctuation (deviation) of a coil $L_P$. Accordingly, the effective threshold voltage $V_{TH\_EFF}$, and further, a threshold current $I_{TH}$ is changed or fluctuates.

In the related art, there is known a technique for suppressing fluctuation of a threshold current $I_{TH}$ according to fluctuation of an input voltage $V_{IN}$. In detail, a threshold voltage $V_{TH}(t)$ that increases as time lapses from turn-on of a switching transistor M1 is generated, and is compared with a sensed voltage $V_{CS}$.

FIG. 4 is a waveform diagram illustrating a current detection in the related art. The slope of the sensed voltage $V_{CS}$ depends on the input voltage $V_{IN}$, and FIG. 4 illustrates (i) a case where the input voltage $V_{IN}$ is high and (ii) a case where the input voltage $V_{IN}$ is low. At a time point t=0, the switching transistor M1 is turned on. As the switching transistor M1 is turned on at the time point t=0, a threshold voltage $V_{TH}(t)$ gradually increases. Therefore, the threshold voltage $V_{TH}(t)$ gets higher as the time lapses from the transition to the ON period $T_{ON}$.

The effective threshold voltage $V_{TH\_EFF}$ is the sensed voltage $V_{CS}$ obtained at a time point after a lapse of the response delay m of the comparator from intersection of the sensed voltage $V_{CS}$ with the threshold voltage $V_{TH}(t)$.

A voltage width (overshoot amount) of the sensed voltage $V_{CS}$ exceeding the threshold voltage $V_{TH}(t)$ during the response delay $\tau_D$ of the comparator increases as the slope of the sensed voltage $V_{CS}$ increases. However, the level of the threshold voltage $V_{TH}(t)$ also increases as the time lapses during the ON period $T_{ON}$. Therefore, an overshoot amount $\Delta V$ can be cancelled, thereby suppressing fluctuation or deviation of the effective threshold voltage $V_{TH\_EFF}$.

After reviewing the current detection method in the related art using the time-varying threshold voltage $V_{TH}$, the inventor of the present disclosure recognized the below technical problems. As illustrated in FIG. 4 (in particular, $V_{CS}$(ii)), when the input voltage $V_{TH}(t)$ is lowered, the slope of the sensed voltage $V_{CS}$ approaches the slope of the threshold voltage $V_{TH}(t)$. If the slopes of the two voltages $V_{CS}$ and $V_{TH}(t)$ approach to each other, due to noise or an offset of the comparator, it becomes difficult to precisely compare the voltages $V_{Cs}$ and $V_{TH}(t)$ having voltage levels close to each other. In detail, there may be a problem in that the output of the comparator is changed while the two voltages $V_{CS}$ and $V_{TH}(t)$ do not intersect with each other or in that the output of the comparator is not changed while the two voltages $V_{Cs}$ and $V_{TH}(t)$ intersect with each other. In some cases, chattering may occur.

SUMMARY

The present disclosure provides a control circuit of a switching converter capable of suppressing fluctuation or deviation of an effective threshold voltage associated with change of an input voltage $V_{IN}$ and capable of performing a precise voltage comparison even if the input voltage $V_{In}$ is low and the slope of a sensed voltage $V_{CS}$ is small.

According to an embodiment of the present disclosure, provided is a control circuit used in a switching converter. The switching converter includes at least, a switching transistor and a coil connected to the switching transistor. The control circuit includes a current comparing circuit that asserts a peak current sensing signal when a current flowing in the coil during the ON period of the switching transistor reaches a certain threshold current. The current comparing circuit includes: a first comparator that compares a sensed voltage according to the current flowing in the switching transistor and the coil with a threshold voltage defining the threshold current, and that generates a comparison signal; and a variable delay circuit that generates the peak current sensing signal by delaying the comparison signal, a delay amount of the peak current sensing signal varying according to a period of time from a turn-on of the switching transistor to a transition of the comparison signal.

The variable delay circuit may include a time measuring part that measures the period of time from the turn-on of the switching transistor to the transition of the comparison signal; and a delaying part that asserts the peak current sensing signal after a delay time, which is proportional to the period of time measured by the time measuring unit, elapses from the transition of the comparison signal.

The variable delay circuit may include a capacitor; a charging/discharging circuit that charges the capacitor with the turn-on of the switching transistor and discharges the capacitor with the transition of the comparison signal; and a second comparator that asserts the peak current sensing signal when a voltage of the capacitor reaches a certain level, while the capacitor is being discharged. In this case, a ratio between a detection time and a variable delay time can be adjusted according to a ratio between a charging current and a discharging current.

The charging/discharging circuit may include a first current source that supplies (source) a first amount of current to the capacitor; a second current source that is switchable between an ON state and an OFF state and that, in the ON state, extracts (sink) a second amount of current from the capacitor, the second amount being greater than the first amount; and a controller that turns on the second current source with the transition of the comparison signal and turns off the second current source with the turn-on of the switching transistor. In this case, the capacitor may be charged with a charging current of the first amount while a second current source is turned off, whereas the capacitor may be discharged with a discharging current corresponding to a difference between the second amount and the first amount while the second current source is turned on. In other words, a ratio between a detection time and a variable delay time may be adjusted according to the first and second amounts generated by two current sources.

The charging/discharging circuit may further include an initialization circuit that resets the voltage of the capacitor to a certain initial voltage during the OFF period of the switching transistor. The second comparator may compare the voltage of the capacitor with the initial voltage.

The variable delay circuit may include a counter that starts one of a count-up operation and a count-down operation with the turn-on of the switching transistor and that starts the other one of the count-up operation and the count-down operation with the transition of the comparison signal. The variable delay circuit may assert the peak current sensing signal when a value counted by the counter reaches a certain value. The variable delay circuit may be configured using a digital counter.

The control circuit may further include: a feedback terminal that receives a feedback voltage which is adjustable to make an output voltage of the switching transistor close to a certain target voltage; a logic part that generates a pulse signal transited to an OFF level in response to the assertion of the peak current sensing signal; and a driver that drives the switching transistor in response to the pulse signal. The current comparing circuit may include an error comparator, as the first comparator, that compares the sensed voltage with the feedback voltage and that, if the sensed voltage becomes higher than the feedback voltage, asserts the comparison signal as an output of the current comparing circuit. The current comparing circuit may be suitably used for a feedback control of a peak current mode and can suppress change of a peak of a coil current.

The control circuit may include an overcurrent protection comparator, as the first comparator, that compares the sensed voltage with an overcurrent protection threshold voltage and that, if the sensed voltage becomes higher than the threshold voltage, asserts the comparison signal as an output of the current comparing circuit. The current comparing circuit may be suitably used for overcurrent protection and can suppress change of a peak of a coil current.

The current comparing circuit may be installed to detect an overcurrent. The control circuit performs a certain overcurrent protection operation when the peak current sensing signal is asserted. The current comparing circuit may be suitably used for overcurrent protection and can suppress change of a peak of a coil current.

The control circuit may be monolithically integrated on a single semiconductor substrate. The term "monolithically integrated" includes a case in which all components constituting a circuit are monolithically integrated on a semiconductor substrate, and also includes a case in which major components of a circuit are monolithically integrated on a semiconductor substrate, where circuit constant adjusting resistors or capacitors may be arranged outside the semiconductor substrate. By integrating the control circuit on a single integrated circuit (IC) chip, a circuit area can be reduced and properties of circuit elements can be uniformly maintained.

According to another embodiment of the present disclosure, provided is a switching converter. The switching converter may include an output circuit and any one of the above-described control circuits. The switching converter may include an output circuit which includes at least, a coil, a switching transistor that is connected to the coil, and a current sensing circuit that generates a sensed voltage according to a current flowing in the coil during the ON period of the switching transistor.

The current comparing circuit may include a current sensing resistor that is arranged in series with the switching transistor and the coil. The current comparing circuit may generate the sensed voltage according to a voltage drop in the current sensing resistor.

According to still another embodiment of the present disclosure, provided is an AC/DC converter. The AC/DC converter includes: a rectification circuit that rectifies an AC voltage; a smoothing capacitor that smoothes an output voltage of the rectification circuit; and any one of the aforementioned switching converters that receives a voltage of the smoothing capacitor as an input voltage.

According to still another embodiment of the present disclosure, provided is an electronic device. The electronic device may include a load; and the aforementioned AC/DC converter that supplies a DC voltage to the load.

According to still another embodiment of the present disclosure, provided is a power adapter. The power adaptor may include the aforementioned AC/DC converter.

Arbitrary combinations of the aforementioned components, or substitutions of the components or expressions of the present disclosure among methods, apparatuses and systems are also effective as embodiments of the present disclosure.

BRIEF DESCRIPTION OF THE DRAWINGS

FIG. 6 is an operation waveform diagram of the control circuit of FIG. 5.

DETAILED DESCRIPTION

Figure 1:
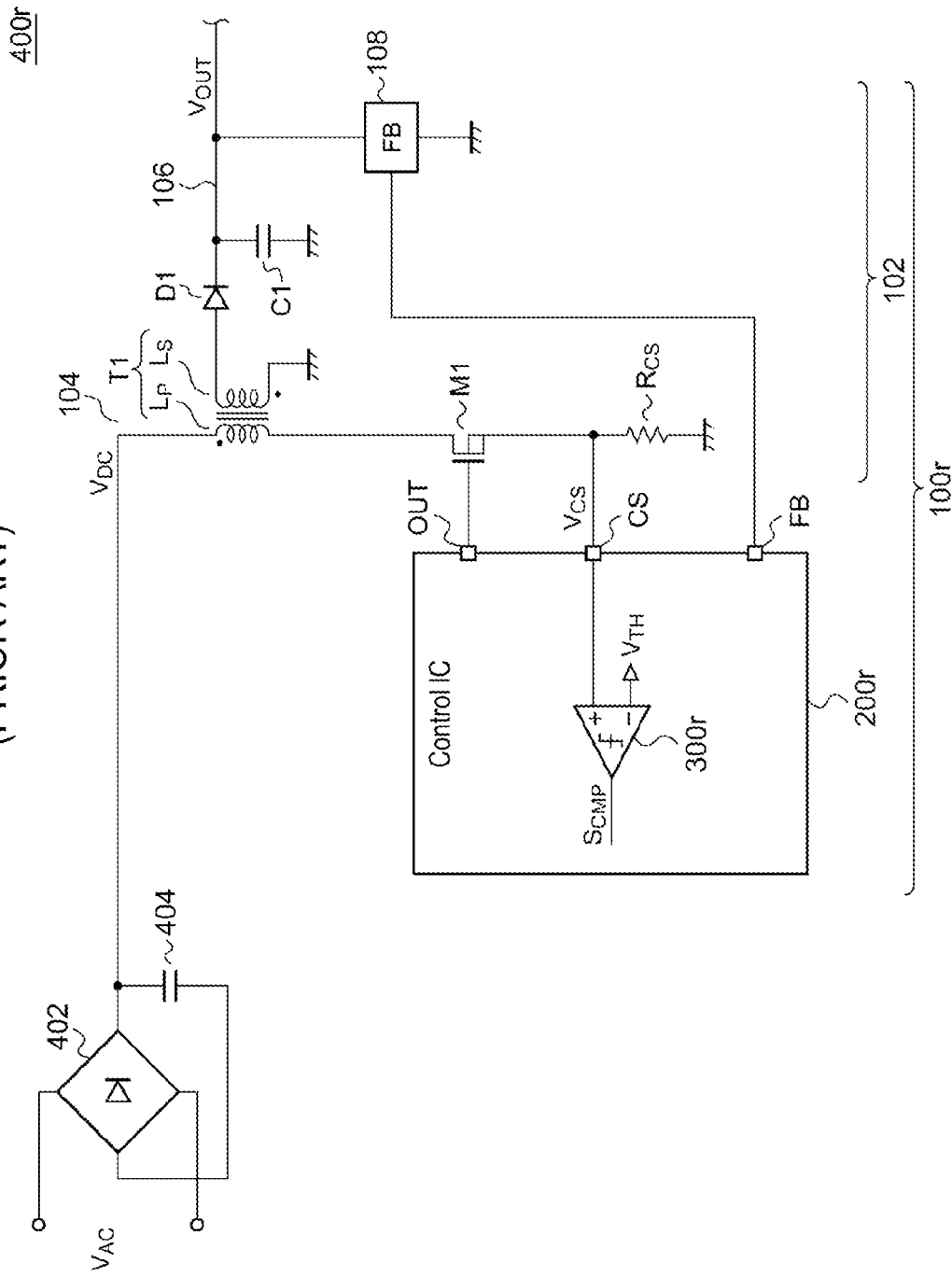
FIG. 1 is a block diagram of an AC/DC converter reviewed by the inventor of the present disclosure.
Figure 2:
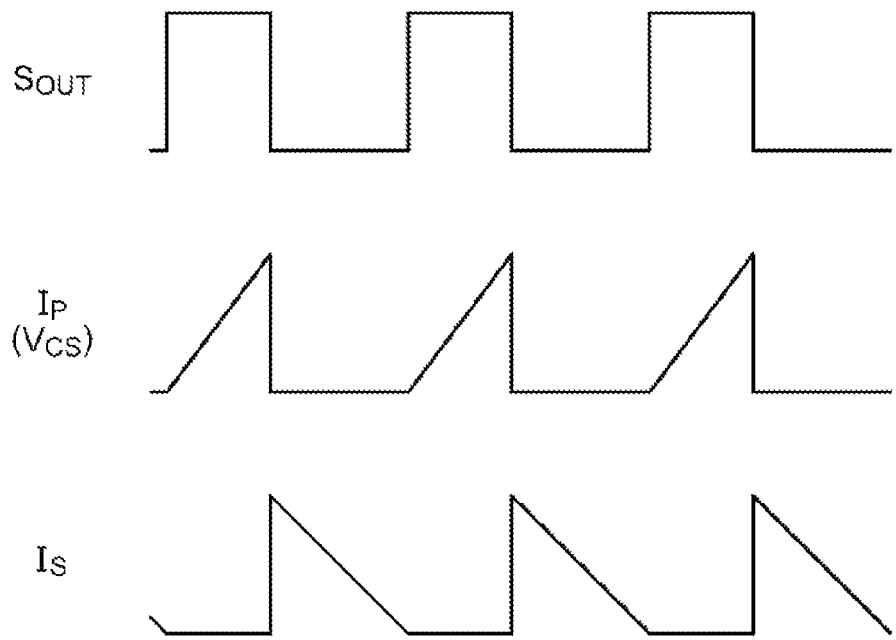
FIG. 2 is an operation waveform diagram of a DC/DC converter.
Figure 3A:
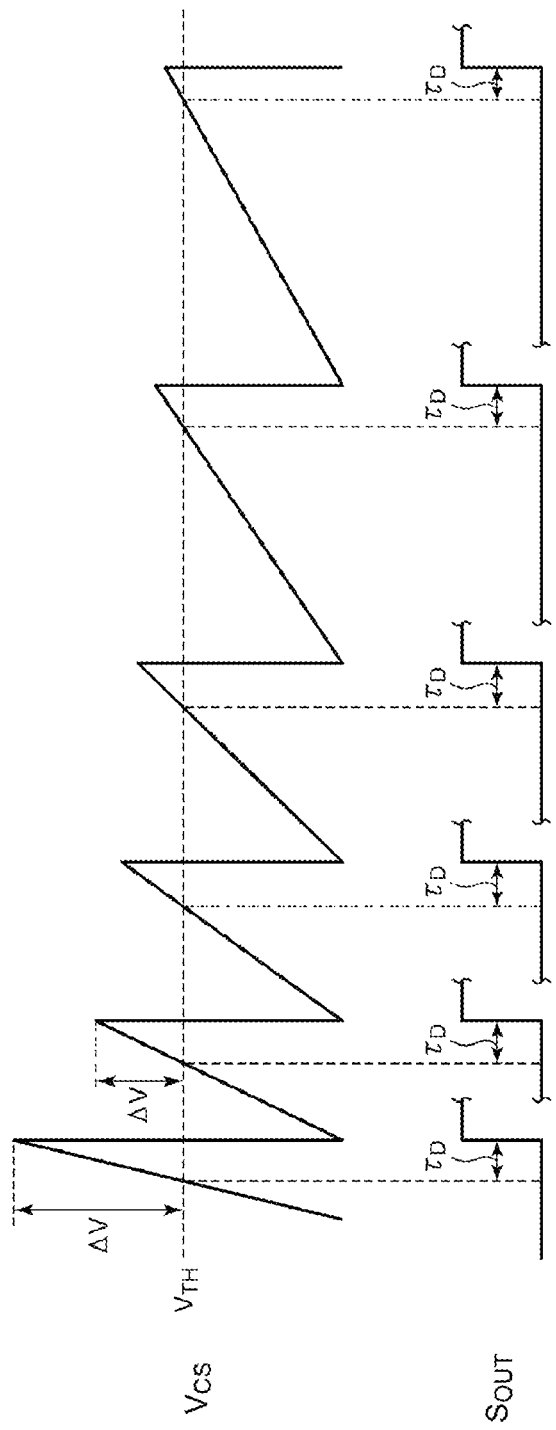
FIG. 3A is an operation waveform diagram of a current comparing circuit.
Figure 3B:
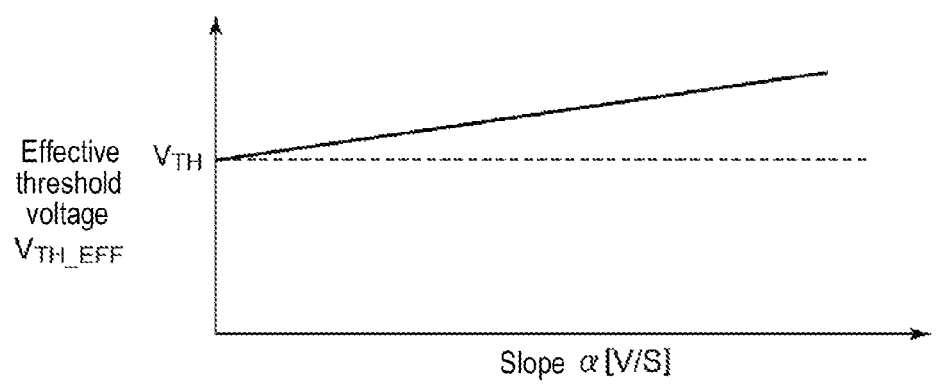
FIG. 3B is a diagram illustrating an effective threshold voltage.
Figure 4:
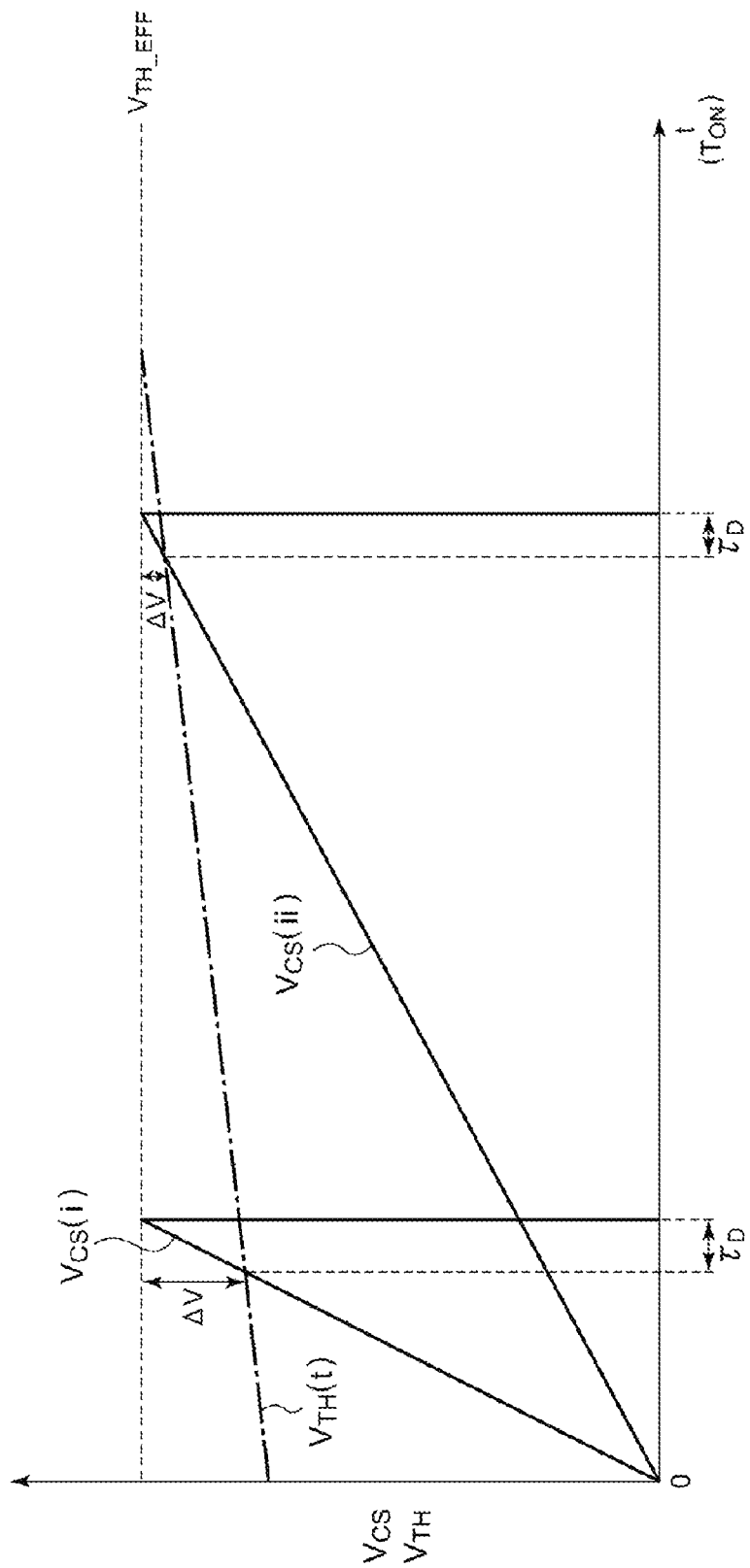
FIG. 4 is a waveform diagram illustrating a current detection in the related art.

Hereinafter, embodiments of the present disclosure will be described with reference to the drawings. The same or equivalent constituting elements, members and processes illustrated in each drawing shall be denoted by the same reference numerals, and the duplicative explanations will be omitted appropriately. The embodiments do not intend to limit the scope of the present disclosure, but exemplify the present disclosure. All of the features and the combinations thereof described in the embodiments are not necessarily essential to the present disclosure.

In the present disclosure, "a state where a member A is connected to a member B" not only includes a state where the member A is physically and directly connected to the member B, but also includes a state where the member A is indirectly connected to the member B via another member that does not affect an electrical connection state therebetween. Likewise, "a state where a member C is provided between a member A and a member B" not only includes a state where the member A and the member C, or the member B and the member C, are connected directly, but also includes a state where the member A and the member C, or the member B and the member C, are connected indirectly via another member that does not affect an electrical connection state therebetween.

Figure 5:
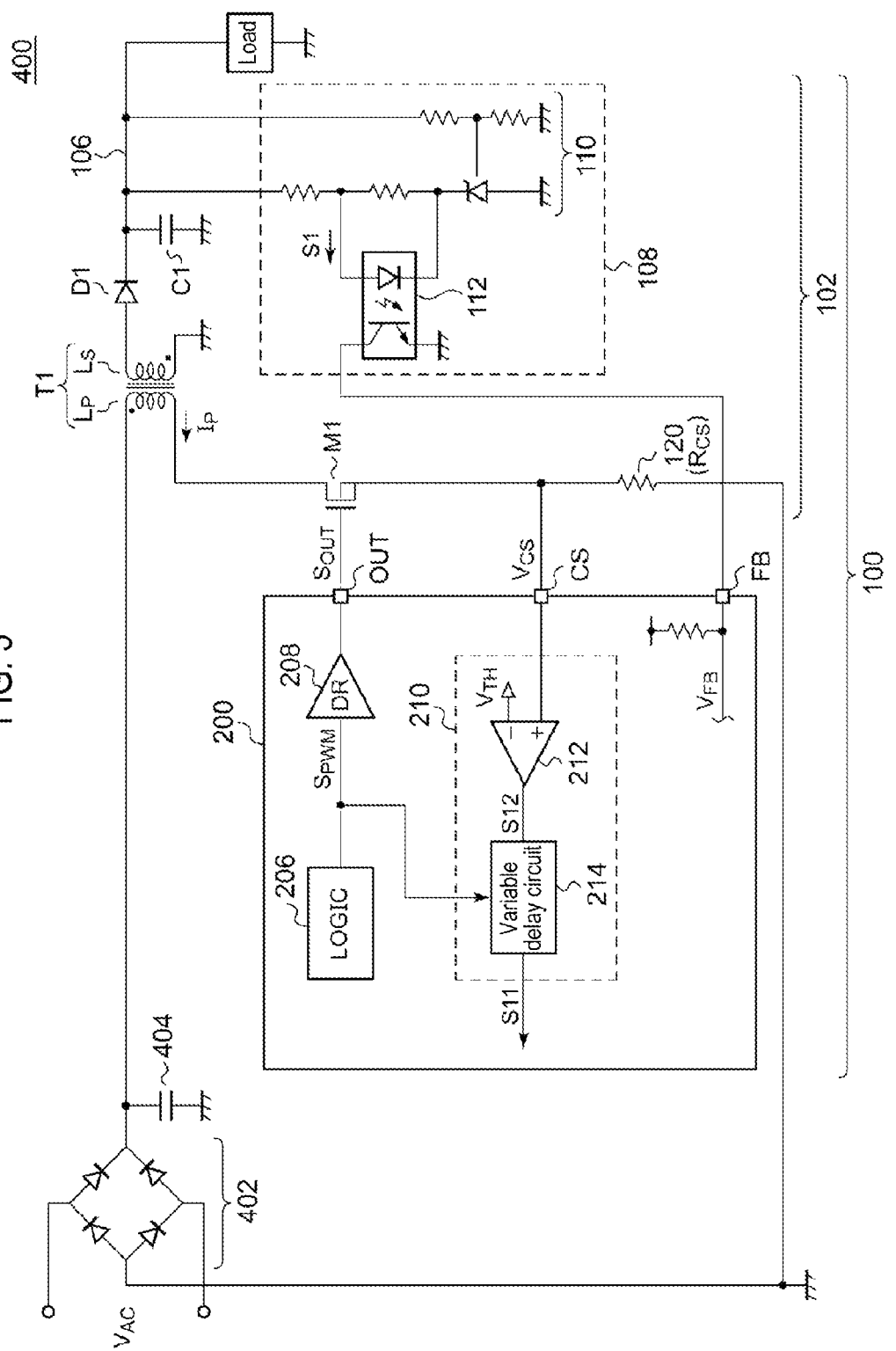
FIG. 5 is a circuit diagram of an AC/DC converter including a control circuit according to an embodiment of the present disclosure.

FIG. 5 is a circuit diagram of an AC/DC converter 400 including a control circuit 200 according to an embodiment of the present disclosure. The AC/DC converter 400 converts an AC voltage $V_{AC}$ to a DC output voltage $V_{OUT}$. Since the basic configuration of the AC/DC converter 400 is identical to the AC/DC converter 400r of FIG. 1, descriptions below will be given with a focus on differences therebetween.

The AC/DC converter 400 includes a rectification circuit 402, a smoothing capacitor 404, and a DC/DC converter 100. The rectification circuit 402 and the smoothing capacitor 404 are identical to those described above with reference to FIG. 1.

The DC/DC converter 100 includes an output circuit 102 and the control circuit 200. The output circuit 102 according to the present embodiment has the topology of a flyback converter. The output circuit 102 includes a transformer T1, a rectifier diode D1, an output capacitor C1, a feedback circuit 108, and a current sensing circuit 120.

The feedback circuit 108 generates a feedback voltage $V_{FB}$ according to the output voltage $V_{OUT}$ of the DC/DC converter 100. For example, the feedback circuit 108 includes a shunt regulator 110 and a photo coupler 112. The shunt regulator 110 amplifies an error between a voltage divided from the DC output voltage $V_{OUT}$ and a certain target voltage $V_{REF}$, thereby generating a feedback signal S1, where the level of the feedback signal S1 is adjusted to make the difference zero.

A primary side light-emitting element of the photo coupler 112 is controlled by the feedback signal S1, and a signal generated at a secondary side light-receiving element of the photo coupler 112 is input to an FB terminal of the control circuit 200 as a feedback voltage $V_{FB}$.

If insulation between a primary side and a secondary side of the transformer T1 is not required, the shunt regulator 110 may be connected to the FB terminal via a wire without the photo coupler 112 interposed therebetween. Furthermore, the function of the shunt regulator 110, that is, an error amplifier may be embedded in the control circuit 200.

The current sensing circuit 120 generates a sensed voltage $V_{CS}$ according to a current flowing in a primary coil $L_P$ of the transformer T1 during the ON period of the switching transistor M1. For example, the current sensing circuit 120 may include a current sensing resistor $R_{CS}$ that is arranged in series with the primary coil $L_P$ and the switching transistor M1, and generate the sensed voltage $V_{CS}$ according to a voltage drop in the current sensing resistor $R_{CS}$.

The control circuit 200 includes a current comparing circuit 210, a logic part 206, and a driver 208, where the current comparing circuit 210, the logic part 206, and the driver 208 are monolithically integrated on a single semiconductor substrate. The logic part 206 is a pulse modulator that generates a pulse signal $S_{PWM}$ instructing ON and OFF of the switching transistor M1. The logic part 206 adjusts the duty ratio of the pulse signal $S_{PWM}$ based on at least the feedback voltage $V_{FB}$ input to the FB terminal, such that the level of the output voltage $V_{OUT}$ of the DC/DC converter 100 approaches a target level. The configuration and modulation method of the logic part 206 are not limited, and technical configurations known in the art may be applied thereto. The driver 208 generates a gate pulse signal $S_{OUT}$ according to the pulse signal $S_{PWM}$ and switches the switching transistor M1.

The current comparing circuit 210 is installed to compare a coil current $I_P$ flowing in the primary coil $L_P$ during the ON period of the switching transistor M1 with a threshold current $I_{TH}$.

If the coil current $I_P$ reaches the threshold current $I_{TH}$, the current comparing circuit 210 asserts a peak current sensing signal S11 (e.g., to a high-level).

The current comparing circuit 210 may be used together with a peak current mode modulator (the logic part 206) to detect whether the coil current $I_P$ reaches a certain peak current $I_{PEAK}$. Alternatively, the current comparing circuit 210 may be used to compare the coil current $I_P$ with an overcurrent protection threshold current $I_{OCP}$ for overcurrent protection. Uses of the current comparing circuit 210 will be described later in detail.

The current comparing circuit 210 includes a first comparator 212 and a variable delay circuit 214. The first comparator 212 compares the sensed voltage $V_{CS}$ according to a coil current $I_P$ flowing in the coil $L_P$ with a threshold voltage $V_{TH}$ defining a threshold current $I_{TH}$ and generates a comparison signal S12. The comparison signal S12 is asserted (to a high level) when the sensed voltage $V_{CS}$ becomes greater than the threshold voltage $V_{TH}$. The first comparator 212 has a certain response delay $\tau_D$ from a time point at which the input sensed voltage $V_{CS}$ intersects with the threshold voltage $V_{TH}$ to a time point at which an output signal S12 of the first comparator 212 is changed.

The variable delay circuit 214 delays the comparison signal S12 and generates the peak current sensing signal S11. A delay amount of the variable delay circuit 214 (hereinafter, referred to as a "variable delay $\tau_{VAT}$") is changed according to a time period (referred to as a "detection time $T_{DET}$") from the turn-on of the switching transistor M1 to the transition (assertion) of the comparison signal S12.

Above is the configuration of the control circuit 200. Next, operations of the control circuit 200 will be described below. FIG. 6 is an operation waveform diagram of the control circuit 200 of FIG. 5. FIG. 6 illustrates a situation when an input voltage $V_{IN}$ decreases as time lapses. A delay $\tau_{TOTAL}$ from a time point at which the sensed voltage $V_{CS}$ intersects with the threshold voltage $V_{TH}$ to a time point at which the peak current sensing signal S11 is transited (asserted) is a sum of the unique fixed delay $\tau_D$ of the first comparator 212 and the variable delay $\tau_{VAR}$ given by the variable delay circuit 214. If the slope of the sensed voltage $V_{CS}$ is α (V/s), the sensed voltage $V_{CS}$ at a time point when the peak current sensing signal S11 is asserted, that is, an effective threshold voltage $V_{TH\_EFF}$ may be obtained according to Equation (1) below.

$$V_{TH\_EFF} = V_{TH} + (\tau_D + \tau_{VAR}) \times \alpha \qquad (1)$$

Here, the slope α of the sensed voltage $V_{CS}$ is inversely proportional to the time period (detection time) $T_{DET}$ from the turn-on of the switching transistor M1 to the transition (assertion) of the comparison signal S12. As described above, the variable delay $\tau_{VAR}$ is adjusted to increase as the detection time $T_{DET}$ increases (in other words, as the slope α decreases). As a result, even if the input voltage $V_{IN}$ decreases, in the second term $(\tau_D + \tau_{VAR}) \times \alpha$ of the right side of Equation (1), increase of $\tau_{VAR}$ and a decrease of α cancel out each other, thereby suppressing change of the effective threshold voltage $V_{TH\_EFF}$. As the change of the effective threshold voltage $V_{TH\_EFF}$ is suppressed, change of an effective threshold current $I_{TH\_EFF}$ of the threshold current $I_{TH}$ that is compared to the coil current $I_P$ is suppressed. In other words, if the current comparing circuit 210 is used for overcurrent protection, a threshold current for overcurrent protection may be maintained constant. Alternatively, if the current comparing circuit 210 is used for a feedback control of a peak current mode, a peak value of the coil current $I_P$ at every switching cycle may be maintained to an amount according to the feedback voltage $V_{FB}$, and thus precision of the output voltage $V_{OUT}$ may be increased.

Furthermore, in the control circuit 200, it may be considered that the threshold voltage $V_{TH}$ is substantially unchanged (constant) regardless of a lapse of time. Therefore, since the first comparator 212 compares the sensed voltage $V_{CS}$ that changes as time lapses with the substantially constant threshold voltage $V_{TH}$, the first comparator 212 may perform a precise voltage comparison, even if the input voltage $V_{IN}$ is low and the slope of the sensed voltage $V_{CS}$ is small.

The present disclosure may be applied to various circuits as illustrated in the block diagram of FIG. 5. Examples of the various circuits will be described below.

Figure 7A:
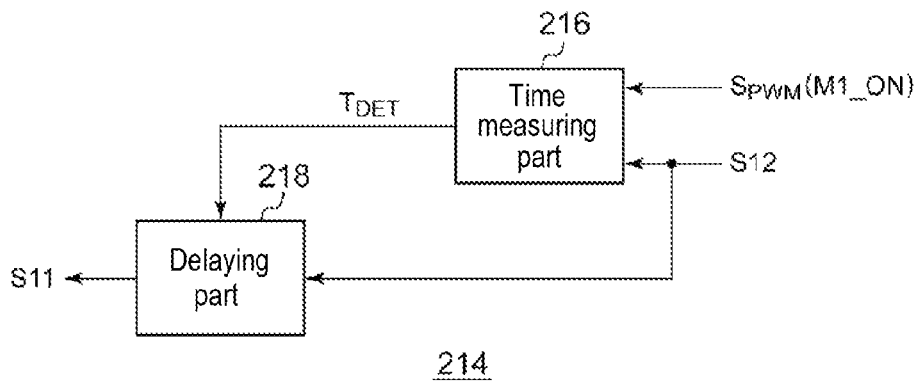
FIGS. 7A to 7C are block diagrams illustrating configuration example of a variable delay circuit.
Figure 7B:
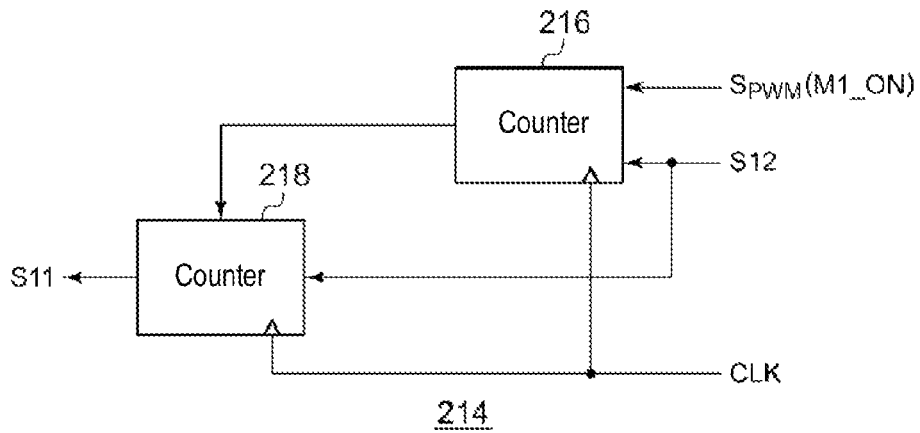
Figure 7C:
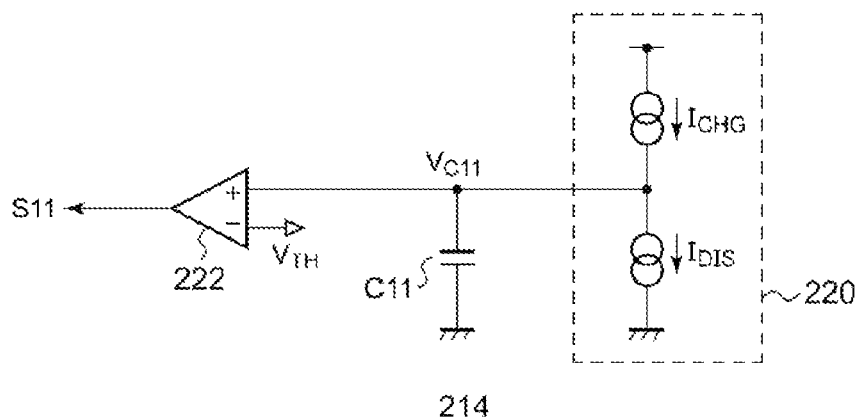

FIGS. 7A to 7C are block diagrams illustrating configuration examples of the variable delay circuit 214. As illustrated in FIG. 7A, the variable delay circuit 214 may include function blocks including a time measuring part 216 and a delaying part 218. The time measuring part 216 measures the time period (detection time) $T_{DET}$ from the turn-on of the switching transistor M1 to the transition of the comparison signal S12. The turn-on of the switching transistor M1 may be detected based on the pulse signal $S_{PWM}$ or may be detected based on a signal (a set pulse described below) that is used for generating the pulse signal $S_{PWM}$.

Information indicating the detection time $T_{DET}$ measured by the time measuring part 216 is input to the delaying part 218. This information may be a voltage, digital data, a current, or an electric charge. The delaying part 218 asserts the peak current sensing signal S11, after the delay time $\tau_{VAR}$ proportional to the detection time $T_{DET}$ elapses from the transition of the comparison signal S12.

For example, the time measuring part 216 and the delaying part 218 may be configured by timers which are constituted by analog circuits or digital circuits. In other words, a timer of the time measuring part 216 is started with the turn-on of the switching transistor M1 and stopped with the transition of the comparison signal S12, thereby measuring the detection time $T_{DET}$. A timer of the delaying part 218 is started with the transition of the comparison signal S12, and asserts the peak current sensing signal S11 after the delay time $\tau_{VAR}$, according to the detection time $T_{DET}$, is elapsed. The time measuring part 216 and the delaying part 218 may be configured to share a single timer via time-sharing.

Referring to FIG. 7B, a case in which the time measuring part 216 and the delaying part 218 are configured by digital timers will be described. A clock having a certain frequency is input to the digital timers. A timer corresponding to the time measuring part 216 starts counting from the turn-on of the switching transistor M1 and stops the counting at the transition of the comparison signal S12. A value counted at this time indicates the detection time $T_{DET}$.

The delaying part 218 starts counting with the transition of the comparison signal S12. The delaying part 218 asserts the peak current sensing signal S11, when a value counted by the delaying part 218 is changed by the value counted by the time measuring part 216 (the detection time $T_{DET}$).

In a case in which the time measuring unit 216 and the delaying unit 218 are configured by a single digital timer, a count-up operation (or a count-down operation) may be started with the turn-on of the switching transistor M1 and a count-down operation (or a count-up operation) may be started with the transition of the comparison signal S12. In this case, the peak current sensing signal S11 may be asserted, if a value counted by the digital timer reaches a certain value.

Referring to FIG. 7C, a case in which the time measuring part 216 and the delaying part 218 are configured to share a single analog timer. The analog timer is configured using a combination of major components including a capacitor C11, a charging/discharging circuit 220 that charges and discharges the capacitor C11, and a voltage comparator (second comparator) 222 that compares a voltage $V_{C11}$ of the capacitor C11 with the threshold voltage $V_{TH}$.

An electric potential at one end of the capacitor C11 is fixed. The charging/discharging circuit 220 charges the capacitor C11 by using a charging current $I_{CHG}$ with the turn-on of the switching transistor M1. Therefore, the voltage $V_{C11}$ of the capacitor C11 increases from a certain initial voltage, where an increment ΔV is proportional to the detection time $T_{DET}$.

$$\Delta V = T_{DET} = I_{CHG}/C11$$

The charging/discharging circuit 220 starts discharging the capacitor C11 by using a discharging current $I_{DIS}$ with the transition of the comparison signal S12. Therefore, the voltage $V_{C11}$ of the capacitor C11 starts decreasing toward the initial voltage. During the discharging of the capacitor C11, if the voltage $V_{C11}$ of the capacitor C11 decreases to a certain level (e.g., the initial voltage) $V_{TH}$, the second comparator 222 asserts the peak current sensing signal S11 (to a low level in FIG. 7C).

It would be obvious to one of ordinary skill in the art that the variable delay circuit 214 is not limited to those illustrated in FIGS. 7A to 7C, but there may be various modifications which are also included within the scope of the present disclosure.

Figure 8:
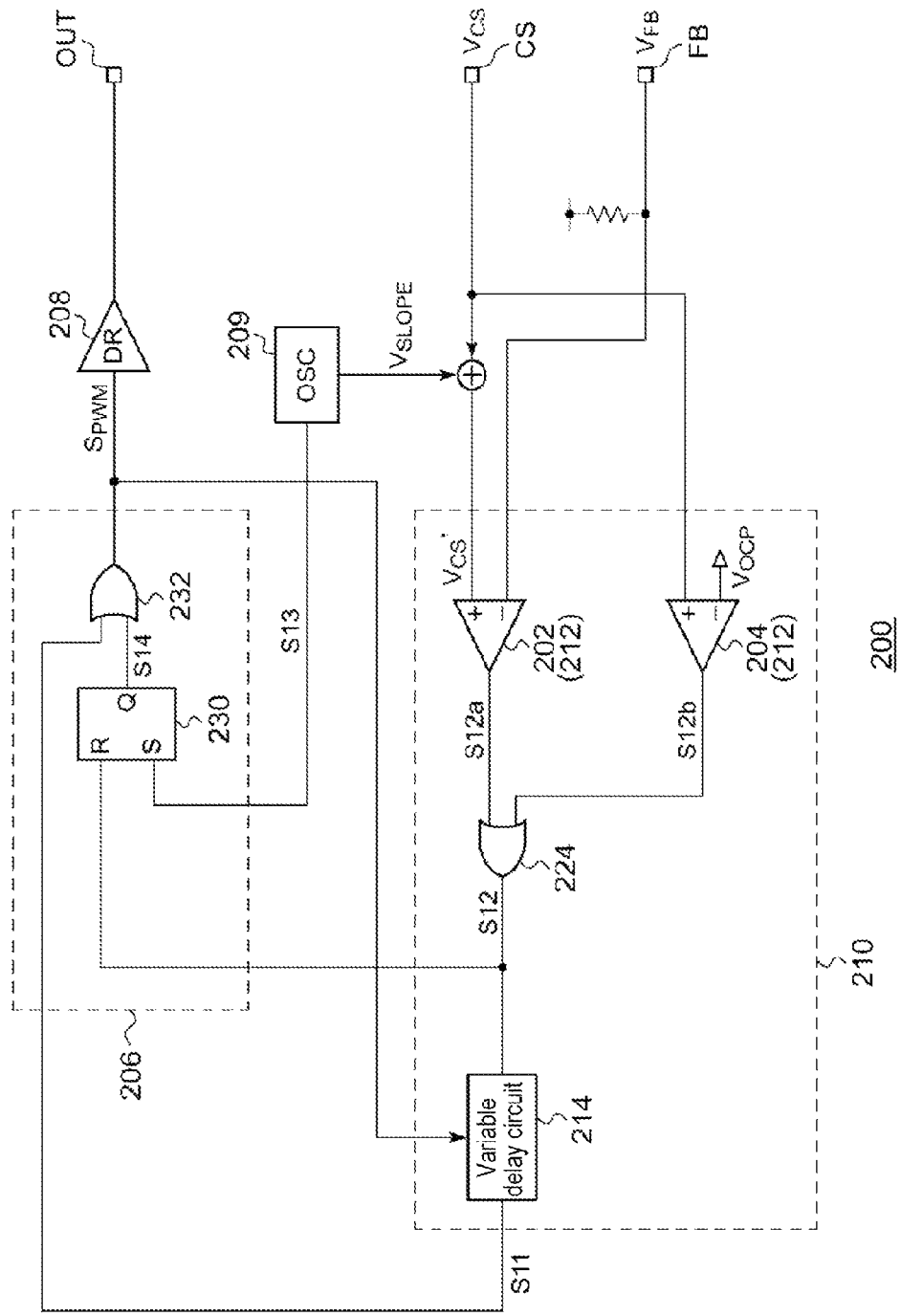
FIG. 8 is a circuit diagram illustrating a detailed example of the control circuit.

FIG. 8 is a circuit diagram illustrating a detailed example of the control circuit 200. The control circuit 200 of FIG. 8 is a peak current mode controller, and includes the logic part 206, the driver 208, the current comparing circuit 210, and an oscillator 209. The oscillator 209 generates a set pulse S13 having a certain frequency. Frequency of the set pulse S13 corresponds to a switching frequency of the switching transistor M1. The logic part 206 transits the pulse signal $S_{PWM}$ to an ON level (a low level) every time the set pulse S13 is asserted (e.g., to a high level).

In addition, the logic part 206 transits the pulse signal $S_{PWM}$ to an OFF level (a high level) in response to assertion of the peak current sensing signal S11 (to a low level in FIG. 8) generated by the current comparing circuit 210.

According to the present embodiment, the current comparing circuit 210 is used for a current comparison for a feedback control of a peak current mode and a current comparison for overcurrent protection.

The current comparing circuit 210 includes an error comparator 202 as the first comparator 212. The error comparator 202 compares a sensed voltage $V_{CS}'$ with the feedback voltage $V_{FB}$ and, if the sensed voltage $V_{CS}'$ becomes higher than the feedback voltage $V_{FB}$, asserts an output of the current comparing circuit 210, that is, a comparison signal S12a (e.g., to a high level). In addition to the set pulse S13, the oscillator 209 generates a slope voltage $V_{SLOPE}$ that is synchronized with the set pulse S13. For stabilization of a feedback loop, the sensed voltage $V_{CS}$ is overlapped by the slope voltage $V_{SLOPE}$ (slope compensation).

The current comparing circuit 210 further includes an overcurrent protecting comparator 204 and the first comparator 212. The overcurrent protecting comparator 204 compares the sensed voltage $V_{CS}$ with an overcurrent protection threshold voltage $V_{OCP}$ and, if the sensed voltage $V_{CS}$ becomes higher than the threshold voltage $V_{OCP}$, asserts an output of the current comparing circuit 210, that is, a comparison signal S12b.

A first logic gate 224 performs a logical operation on the comparison signals S12a and S12b of the error comparator 202 and the overcurrent protecting comparator 204, respectively, and, if at least one of the comparison signals S12a and S12b is asserted, asserts an output signal S12 of the first logic gate 224. If assertion of the comparison signals S12a and S12b is assigned with a high level, the first logic gate 224 may be configured using an OR gate.

The variable delay circuit 214 gives a variable delay WAR to the comparison signal S12, which is the output of the first logic gate 224, and asserts an output of the variable delay circuit 214 (to a low level) after the variable delay τVAR is elapsed from the transition (assertion) of the comparison signal S12.

The logic part 206 includes an RS flip-flop 230 and a second logic gate 232. The RS flip-flop 230 receives the set pulse S13 via a set terminal thereof and receives the comparison signal S12 via a reset terminal thereof. The second logic gate 232 performs a logical operation on an output signal S14 of the RS flip-flop 230 and the peak current sensing signal S11. When assertion of the peak current sensing signal S11 is assigned with a low level and an ON level of the signal S14 is a high level, the second logic gate 232 may be configured using an OR gate.

Figure 9:
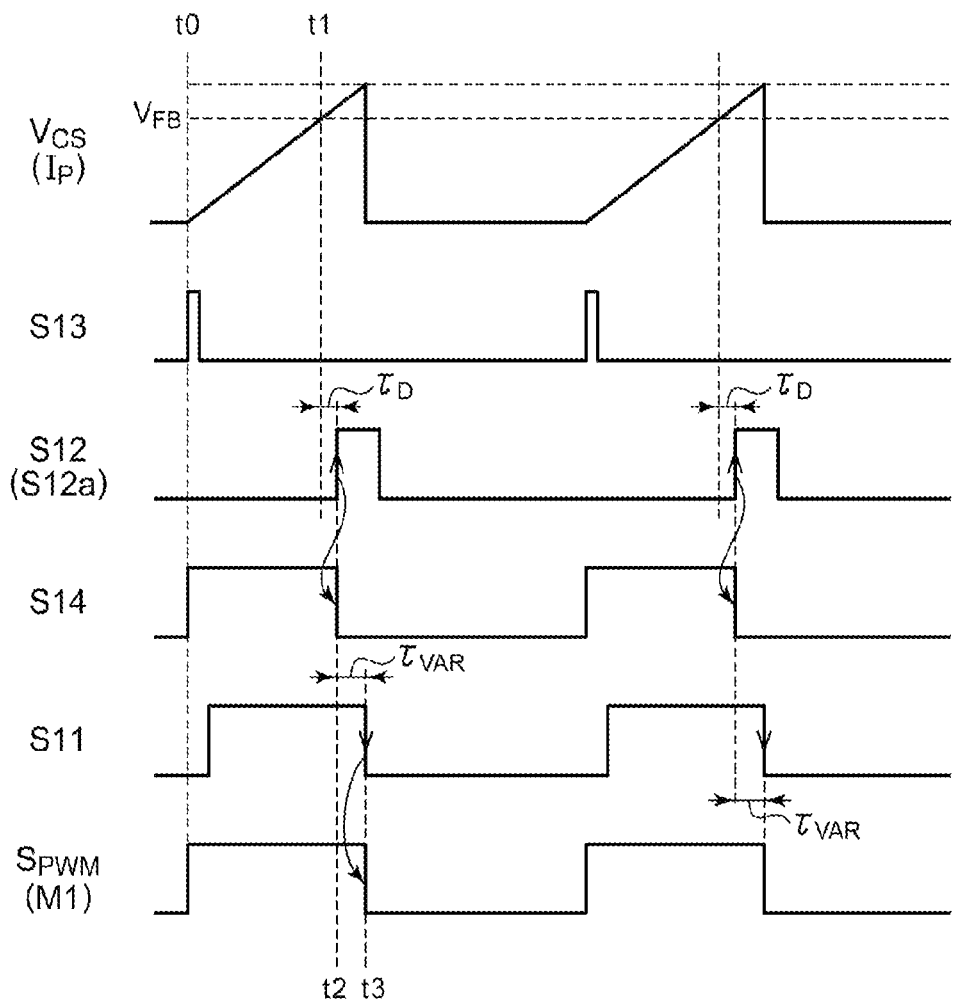
FIG. 9 is an operation waveform diagram of the control circuit of FIG. 8.

Next, operation of the control circuit 200 of FIG. 8 will be described. FIG. 9 is an operation waveform diagram of the control circuit 200 of FIG. 8. FIG. 9 illustrates a feedback control performed by the error comparator 202. Every time the set pulse S13 is asserted (t0), the RS flip-flop 230 is set to make the output signal S14 of the RS flip-flop 230 an ON level, and the switching transistor M1 is turned on. Next, the coil current $I_P$ flowing in the primary coil $L_P$ and the switching transistor M1 increases as time lapses. When the sensed voltage $V_{CS}$ exceeds the feedback voltage $V_{FB}$ (t1), the comparison signal S12 is asserted after a delay $τ_D$ (t2), and the RS flip-flop 230 is reset. At this time, since an output of the variable delay circuit 214 is negated (to a high level), the pulse signal $S_{PWM}$, which is an output of the second logic gate 232, is maintained at a high level.

When the peak current sensing signal S11 is asserted (to a low level) after a variable delay $τ_{VAR}$ is elapsed from the assertion of the comparison signal S12 (t3), the pulse signal $S_{PWM}$ is transited to an OFF level (low level), and the switching transistor M1 is turned off. Thereafter, when the set pulse S13 is asserted, the pulse signal $S_{PWM}$ is transited to an ON level and the switching transistor M1 is turned on again.

Above is the operation of the control circuit 200. As described above, in the current comparing circuit 210, an output of the error comparator 202 is delayed via the variable delay circuit 214. Thus, the current comparing circuit 210 can be suitably used for a feedback control of a peak current mode, and the change of a peak of the coil current $I_P$ can be suppressed.

An overcurrent protection operation may be described by replacing $V_{FB}$ and S12a in FIG. 9 with $V_{TH}$ and S12b, respectively. In the current comparing circuit 210, change of the overcurrent protection threshold current $I_{TH}$ may be suppressed by delaying an output of the overcurrent protecting comparator 204 via the variable delay circuit 214. In the control circuit 200 of FIG. 8, the switching transistor M1 is turned off for every pulse with an assertion of the comparison signal S12b of the overcurrent protecting comparator 204. The overcurrent protection operation is not limited to turning-off the switching transistor M1 for every pulse, but may be implemented using other methods including a protection using a timer latch.

Figure 10:
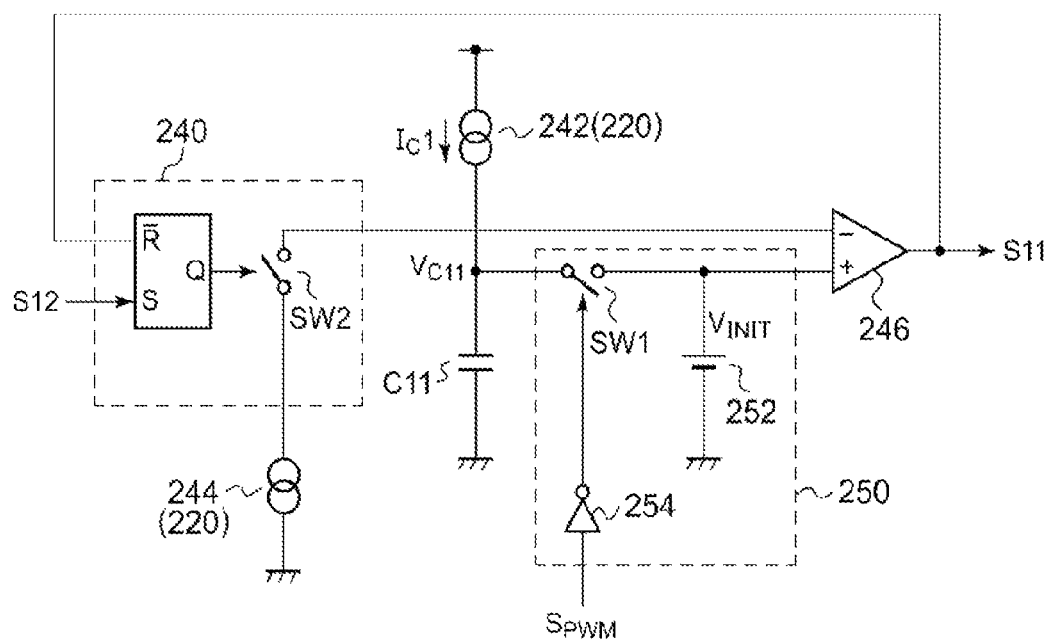
FIG. 10 is a circuit diagram illustrating a configuration example of the variable delay circuit.

FIG. 10 is a circuit diagram illustrating a configuration example of the variable delay circuit 214. The variable delay circuit 214 may be understood as a detailed example of the variable delay circuit 214 of FIG. 7C. The variable delay circuit 214 includes a capacitor C11, a first current source 242, a second current source 244, a second comparator 246, a controller 240, and an initialization circuit 250.

The controller 240 switches the charging/discharging circuit 220 between a charging state and a discharging state in response to the comparison signal S12 and the pulse signal $S_{PWM}$. The first current source 242 supplies a current $I_C1$ of a first amount to the capacitor C11. The second current source 244 may be switched between an ON state and an OFF state and, in the ON state, extracts a current $I_C2$ of a second amount from the capacitor C11, where the second amount is greater than the first amount. The second current source 244 is turned on and off according to turn-on and turn-off of a second switch SW2. The controller 240 turns on the second current source 244 with the transition of the comparison signal S12 and turns off the second current source 244 with the turn-on of the switching transistor M1. Here, the turn-off of the switching transistor M1 takes place based on assertion of the peak current sensing signal S11, which is the output of the variable delay circuit 214. The controller 240 turns off the second current source 244 with the assertion of the peak current sensing signal S11.

The controller 240 may be configured using a flip-flop that is set by the comparison signal S12 and is reset by the peak current sensing signal S11. The second switch SW2 is controlled by an output Q of the flip-flop.

The charging/discharging circuit 220 (i) charges the capacitor C11 by using the charging current $I_{CHG}$ ($=I_{C1}$) when the second switch SW2 is turned off and (ii) discharges the capacitor C11 by using the discharging current $I_{DIS}$, which is a difference between a second current $I_{C2}$ and a first current $I_{C1}$ ($I_{C2}-I_{C1}$), when the second switch SW2 is turned on.

The initialization circuit 250 resets the voltage $V_{C11}$ of the capacitor C11 to an initial voltage $V_{INIT}$ during the ON period of the switching transistor M1. A voltage source 252 generates the initial voltage $V_{INIT}$. A first switch SW1 is arranged between the capacitor C11 and the voltage source 252. An inverter 254 inverses the pulse signal $S_{PWM}$, thereby turning on the first switch SW1 during the OFF period of the switching transistor M1.

The second comparator 246 compares the voltage $V_{C11}$ of the capacitor C11 with the initial voltage $V_{INIT}$ while the capacitor C11 is being discharged. If the voltage $V_{C11}$ decreases to the initial voltage $V_{INIT}$, the peak current sensing signal S11 is set to a low level (assertion).

Figure 11:
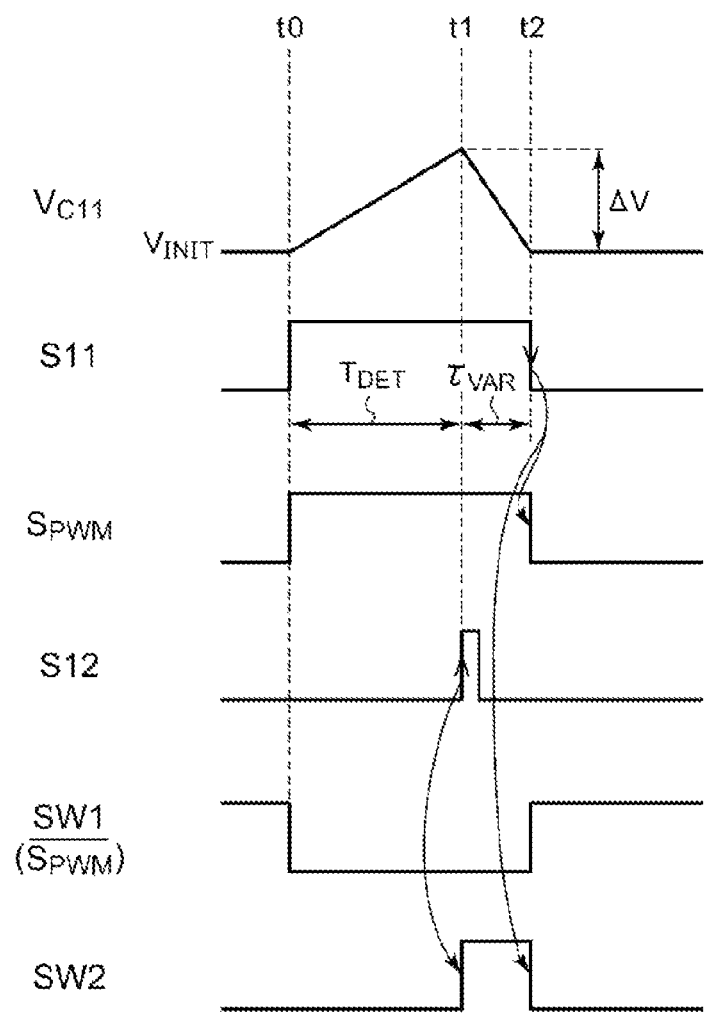
FIG. 11 is an operation waveform diagram of the variable delay circuit of FIG. 10.

FIG. 11 is an operation waveform diagram of the variable delay circuit 214 of FIG. 10. While the pulse signal $S_{PWM}$ is at a low level and the switching transistor M1 is turned off, the voltage $V_{C11}$ is fixed to the initial voltage $V_{INIT}$. When the pulse signal $S_{PWM}$ is set to a high level (t0), the charging/discharging circuit 220 is switched to a charging state and the capacitor C11 is charged by the first current $I_{C1}$. Thus, the voltage $V_{C11}$ increases at a constant slope. When the comparison signal S12 is transited (t1), the second switch SW2 is turned on and the charging/discharging circuit 220 is switched to a discharging state. Therefore, the voltage $V_{CH}$ decreases at a constant slope as time lapses. When the voltage $V_{C11}$ reaches the initial voltage $V_{INIT}$, the peak current sensing signal S11 is asserted (to a low level).

The increment ΔV of the capacitor voltage $V_{C11}$ during the detection period $T_{DET}$ is given by the below equation.

$$ΔV=T_{DET} \times I_{C1}/C11$$

The variable delay $τ_{VAR}$ according to the discharging period from t1 to t2 is given by the below equation.

$$τ_{VAR}=ΔV/(I_{C2}-I_{C1}) \times C_{11}=T_{DET} \times I_{C1}/(I_{C2}-I_{C1})$$

As described above, the variable delay circuit 214 of FIG. 10 can generate the variable delay $τ_{VAR}$ which is in proportion to the detection time $T_{DET}$.

(Modifications)

Hereinbefore, an embodiment of the present disclosure has been described. However, the embodiment described above is merely an example, and it would be obvious to one of ordinary skill in the art that various modifications may be made therein based on combinations of the respective components or the respective operations and such modifications are also within the scope of the present disclosure. Hereinafter, such modifications will be described.

First Modification

In FIG. 5, detection of the coil current $I_P$ via the current sensing circuit 120 is performed by using the current sensing resistor $R_{CS}$ arranged between a source of the switching transistor M1 and the ground. However, the present disclosure is not limited thereto. For example, the source of the switching transistor M1 may be grounded, and the current sensing resistor $R_{CS}$ may be inserted between the ground and a cathode of the rectification circuit 402. In this case, the sensed voltage $V_{CS}$ becomes a negative voltage $V_{CS} = -R_{CS} \times I_P$. Thus, an amplifier for inverting the sensed voltage $V_{CS}$ may be added to the control circuit 200 so that the output of the amplifier is input to the current comparing circuit 210.

Alternatively, the ON resistance of the switching transistor M1 may be used as a current sensing register and a drain voltage of the switching transistor M1 may be used as the sensed voltage $V_{CS}$. Alternatively, an auxiliary coil may be added to the transformer T1 to detect a current flowing in the auxiliary coil. Alternatively, a current sensing transistor having a common gate and a common source with the switching transistor M1 may be added to form a current mirror circuit, thereby extracting a current proportional to a coil current $I_P$. Also, the current sensing circuit 120 may employ other technical configurations known in the art.

Second Modification

There may be various modifications in modulation methods and configurations of the logic part 206. For example, in the logic part 206 of FIG. 8, assertion of the peak current sensing signal S11 may be assigned with a high level, the second logic gate 232 may be omitted, and the peak current sensing signal S11 may be input to the reset terminal of the RS flip-flop 230.

Alternatively, the logic part 206 may be an average current mode modulator or a voltage mode modulator, and further, configurations thereof are not limited.

Third Modification

Although a case in which the current comparing circuit 210 is used for a feedback control of the peak current mode or for overcurrent protection is described in the above embodiment, the present disclosure is not limited thereto, and the current comparing circuit 210 may be used for various signal processing based on the coil current $I_P$.

Fourth Modification

Although a control circuit for the flyback type DC/DC converter 100 is described in the above embodiment, types of switching converters are not limited thereto. For example, the DC/DC converter 100 may be a forward type, or may be a back converter or a boost converter. Topology of the output circuit 102 may be changed based on the type of the switching converter.

Fifth Modification

In the variable delay circuit 214 of FIG. 10, the variable delay $\tau_{VAR}$ is proportional to the detection time $T_{DET}$. However, the present disclosure is not limited thereto, and a correspondence relationship between the variable delay $\tau_{VAR}$ and the detection time $T_{DET}$ may be optimized to further reduce change of the effective threshold voltage $V_{TH\_EFF}$.

Uses

Finally, uses of the AC/DC converter 400 will be described. The AC/DC converter 400 may be suitably applied to an AC adaptor or a power supply block of electronic devices.

Figure 12:
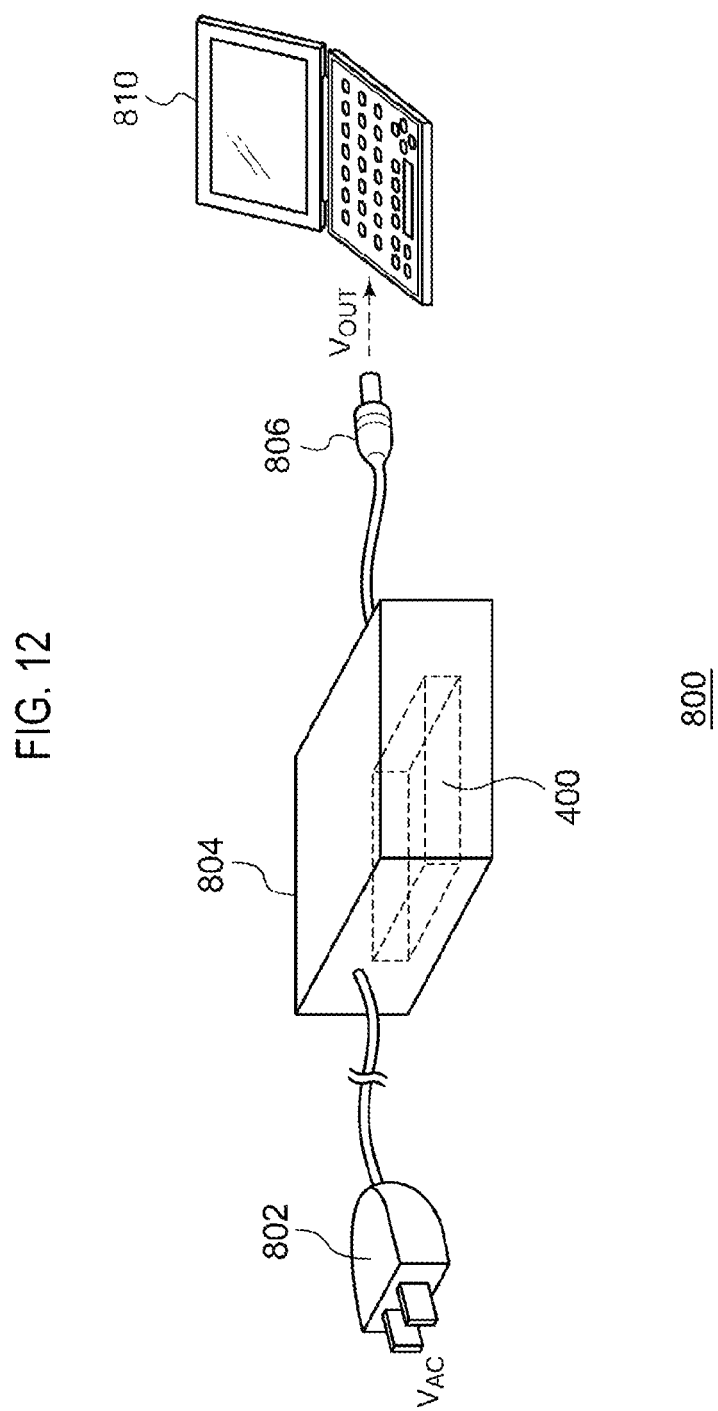
FIG. 12 illustrates an AC adaptor including an AC/DC converter.

FIG. 12 illustrates an AC adaptor 800 including an AC/DC converter 400. The AC adaptor 800 includes a plug 802, a housing 804, and a connector 806. The plug 802 receives a commercial AC voltage $V_{AC}$ from a power outlet (not shown). The AC/DC converter 400 is mounted inside the housing 804. A DC output voltage $V_{OUT}$ generated by the AC/DC converter 400 is supplied to an electronic device 810 via the connector 806. Examples of the electronic device 810 may include a laptop PC, a digital camera, a digital video camera, a mobile phone, a portable audio player, etc.

Figure 13A:
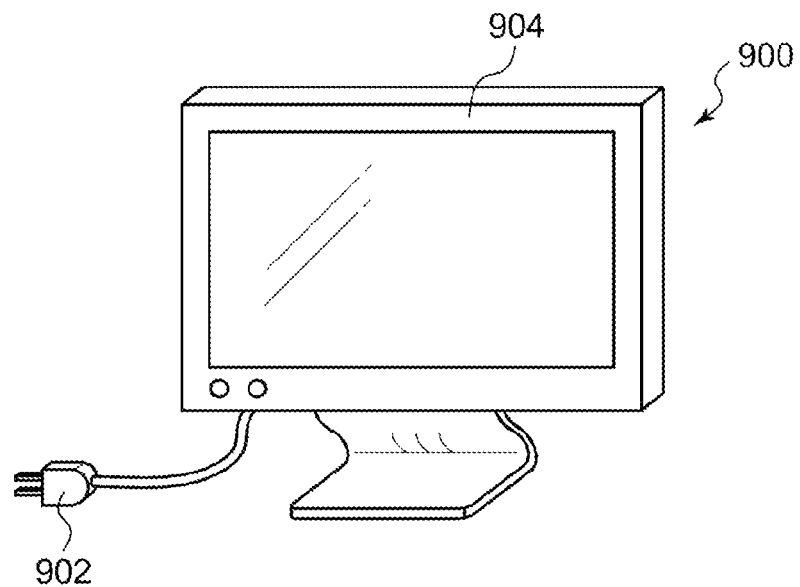
FIGS. 13A and 13B illustrate electronic devices including an AC/DC converter.
Figure 13B:
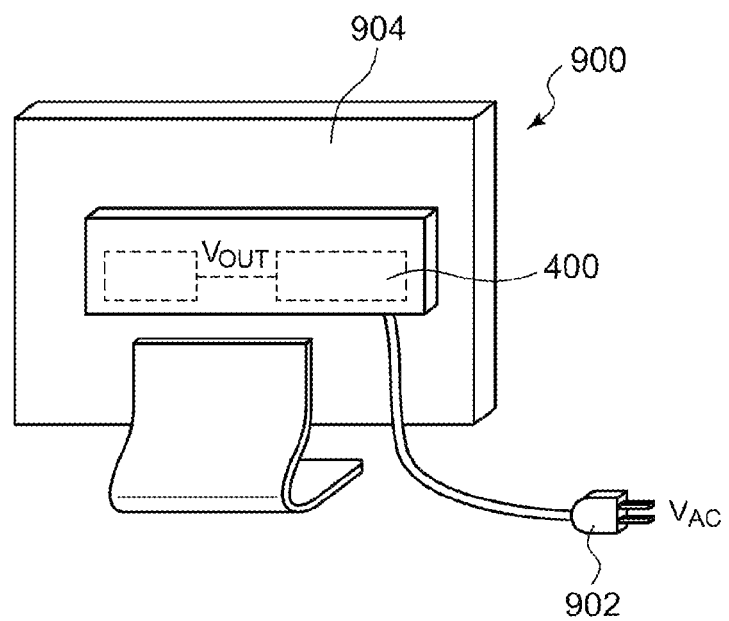

FIGS. 13A and 13B illustrate an electronic device 900 including an AC/DC converter 400. The electronic device 900 shown in FIGS. 13A and 13B is a display device. However, types of the electronic device 900 are not limited thereto, and the electronic device 900 may be other devices including a power supply device therein, e.g., an audio device, a refrigerator, a washing machine, a cleaning machine, etc. A plug 902 receives a commercial AC voltage $V_{AC}$ from a power outlet (not shown). The AC/DC converter 400 is mounted inside a housing 904. A DC output voltage $V_{OUT}$ generated by the AC/DC converter 400 is supplied to a load mounted in the housing 904, e.g., a microcomputer, a digital signal processor (DSP), a power supply circuit, an illumination device, an analog circuit, a digital circuit, etc.

According to an embodiment of the present disclosure, change or fluctuation of an effective threshold voltage can be suppressed.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A control circuit used in a switching converter including at least, a switching transistor and a coil connected to the switching transistor, the control circuit comprising:
    a current comparing circuit that asserts a peak current sensing signal when a current flowing in the coil during the ON period of the switching transistor reaches a certain threshold current,
    wherein the current comparing circuit includes:
        a first comparator that compares a sensed voltage according to the current flowing in the switching transistor and the coil with a threshold voltage defining the threshold current, and generates a comparison signal; and
        a variable delay circuit that generates the peak current sensing signal by delaying the comparison signal, a delay amount of the peak current sensing signal varying according to a period of time from a turn-on of the switching transistor to a transition of the comparison signal.

2. The control circuit of claim 1, wherein the variable delay circuit includes:
a time measuring part that measures the period of time from the turn-on of the switching transistor to the transition of the comparison signal; and
a delaying part that asserts the peak current sensing signal after a delay time, which is proportional to the period of time measured by the time measuring part, elapses from the transition of the comparison signal.

3. The control circuit of claim 1, wherein the variable delay circuit includes:
a capacitor;
a charging/discharging circuit that charges the capacitor with the turn-on of the switching transistor and discharges the capacitor with the transition of the comparison signal; and
a second comparator that asserts the peak current sensing signal when a voltage of the capacitor reaches a certain level, while the capacitor is being discharged.

4. The control circuit of claim 3, wherein the charging/discharging circuit includes:
a first current source that supplies a first amount of current to the capacitor;
a second current source that is switchable between an ON state and an OFF state and that, in the ON state, extracts a second amount of current from the capacitor, the second amount being greater than the first amount; and
a controller that turns on the second current source with the transition of the comparison signal and turns off the second current source with the turn-on of the switching transistor.

5. The control circuit of claim 3, wherein the charging/discharging circuit further includes an initialization circuit that resets the voltage of the capacitor to a certain initial voltage during the OFF period of the switching transistor, and
the second comparator compares the voltage of the capacitor with the initial voltage.

6. The control circuit of claim 1, wherein the variable delay circuit includes a counter that starts one of count-up and count-down operations with the turn-on of the switching transistor and that starts the other one of the count-up and count-down operations with the transition of the comparison signal, and,
wherein the variable delay circuit asserts the peak current sensing signal when a value counted by the counter reaches a certain value.

7. The control circuit of claim 1, further comprising:
a feedback terminal that receives a feedback voltage which is adjustable to make an output voltage of the switching transistor close to a certain target voltage;
a logic part that generates a pulse signal transited to an OFF level in response to the assertion of the peak current sensing signal; and
a driver that drives the switching transistor in response to the pulse signal,
wherein the current comparing circuit includes an error comparator, as the first comparator, that compares the sensed voltage with the feedback voltage and that, if the sensed voltage becomes higher than the feedback voltage, asserts the comparison signal as an output of the current comparing circuit.

8. The control circuit of claim 1, further comprising:
a logic part that generates a pulse signal transited to an OFF level in response to the assertion of the peak current sensing signal; and
a driver that drives the switching transistor in response to the pulse signal,
wherein the current comparing circuit includes an overcurrent protection comparator, as the first comparator, that compares the sensed voltage with an overcurrent protection threshold voltage and that, if the sensed voltage becomes higher than the threshold voltage, asserts the comparison signal as an output of the current comparing circuit.

9. The control circuit of claim 1, wherein the current comparing circuit is installed to detect an overcurrent, and
wherein the control circuit performs a certain overcurrent protection operation when the peak current sensing signal is asserted.

10. The control circuit of claim 1, wherein the control circuit is monolithically integrated on a single semiconductor substrate.

11. A switching converter comprising:
an output circuit which includes at least, a coil, a switching transistor that is connected to the coil, and a current sensing circuit that generates a sensed voltage according to a current flowing in the coil during the ON period of the switching transistor; and
the control circuit of claim 1.

12. The switching converter of claim 11, wherein the current comparing circuit includes a current sensing resistor that is arranged in series with the switching transistor and the coil, and
wherein the current comparing circuit generates the sensed voltage according to a voltage drop in the current sensing resistor.

13. An AC/DC converter comprising:
a rectification circuit that rectifies an AC voltage;
a smoothing capacitor that smooths an output voltage of the rectification circuit; and
a switching converter that receives a voltage of the smoothing capacitor as an input voltage,
wherein the switching converter includes at least:
a coil, a switching transistor that is connected to the coil, and a current sensing circuit that generates a sensed voltage according to a current flowing in the coil during the ON period of the switching transistor; and
the control circuit of claim 1.

14. An electronic device comprising:
a load; and
the AC/DC converter of claim 13 that supplies a DC voltage to the load.

15. A power adaptor comprising the AC/DC converter of claim 13.

16. A current sensing method for a switching converter including at least, a switching transistor and a coil connected to the switching transistor, the method comprising:
converting a current flowing in the coil during the ON period of the switching transistor to a sensed voltage;
comparing the sensed voltage with a threshold voltage having a certain voltage level to generate a comparison signal; and
generating a peak current sensing signal by delaying the comparison signal, a delay amount of the peak current sensing signal varying according to a time period from a turn-on of the switching transistor to a transition of the comparison signal.

17. The current sensing method of claim 16, wherein generating a peak current sensing signal includes:
   measuring a period of time from the turn-on of the switching transistor to the transition of the comparison signal; and
   asserting the peak current sensing signal after a delay time, which is proportional to the period of time, elapses from the transition of the comparison signal.

18. The current sensing method of claim 16, wherein generating a peak current sensing signal includes:
   charging a capacitor with the turn-on of the switching transistor and discharging the capacitor with the transition of the comparison signal; and,
   asserting the peak current sensing signal when a voltage of the capacitor reaches a certain level, while the capacitor is being discharged.

19. The current sensing method of claim 16, wherein generating a peak current sensing signal includes:
   starting, by a counter, one of a count-up operation and a count-down operation with the turn-on of the switching transistor;
   starting, by the counter, the other one of the count-up operation and the count-down operation with the transition of the comparison signal; and,
   asserting the peak current sensing signal, when a value counted by the counter reaches a certain value, while the other one of the count-up operation and the count-down operation is being performed.

* * * * *